United States Patent
Reznicek et al.

(10) Patent No.: US 11,450,659 B2
(45) Date of Patent: Sep. 20, 2022

(54) ON-CHIP DECOUPLING CAPACITOR

(71) Applicant: International Business Machines Corporation, Armonk, NY (US)

(72) Inventors: Alexander Reznicek, Troy, NY (US); Ruilong Xie, Niskayuna, NY (US); Jingyun Zhang, Albany, NY (US); Lan Yu, Voorheesville, NY (US)

(73) Assignee: International Business Machines Corporation, Armonk, NY (US)

( * ) Notice: Subject to any disclaimer, the term of this patent is extended or adjusted under 35 U.S.C. 154(b) by 57 days.

(21) Appl. No.: 16/816,372

(22) Filed: Mar. 12, 2020

(65) Prior Publication Data
US 2021/0288046 A1  Sep. 16, 2021

(51) Int. Cl.
| H01L 27/06 | (2006.01) |
| H01L 23/64 | (2006.01) |
| H01L 23/482 | (2006.01) |
| H01L 27/108 | (2006.01) |
| H01L 49/02 | (2006.01) |

(52) U.S. Cl.
CPC ...... *H01L 27/0629* (2013.01); *H01L 23/4821* (2013.01); *H01L 23/642* (2013.01); *H01L 28/86* (2013.01)

(58) Field of Classification Search
CPC ... H01L 27/0629; H01L 28/40; H01L 23/642; H01L 27/1082; H01L 27/10879; H01L 27/10829; H01L 28/60; H01L 28/91
See application file for complete search history.

(56) References Cited

U.S. PATENT DOCUMENTS

| 7,709,301 | B2 | 5/2010 | Bosshart | |
| 8,952,423 | B2 | 2/2015 | Jeon | |
| 9,123,773 | B1 | 9/2015 | Shen | |
| 9,653,583 | B1 | 5/2017 | Zhao | |
| 9,734,276 | B2 | 8/2017 | Kim | |
| 9,748,226 | B1 | 8/2017 | Chen | |
| 9,865,592 | B2 | 1/2018 | Hu | |
| 9,865,704 | B2 | 1/2018 | Xie | |
| 10,014,370 | B1 | 7/2018 | Xie | |
| 2006/0124982 | A1* | 6/2006 | Ho | H01L 27/0805 257/304 |
| 2016/0126245 | A1* | 5/2016 | Liu | H01L 27/10826 438/241 |
| 2017/0358565 | A1 | 12/2017 | Hensel | |
| 2020/0168610 | A1* | 5/2020 | Lu | H01L 28/86 |
| 2020/0411635 | A1* | 12/2020 | Lajoie | H01L 28/60 |

FOREIGN PATENT DOCUMENTS

KR  20160047380 A  5/2016

* cited by examiner

*Primary Examiner* — Omar F Mojaddedi
(74) *Attorney, Agent, or Firm* — David K. Mattheis; Maeve Carpenter

(57) ABSTRACT

A semiconductor device including a decoupling capacitor disposed between adjacent device source-drain regions, the decoupling capacitor comprising an outer metal liner, a dielectric disposed adjacent to the outer metal liner, and an inner metal liner disposed adjacent to the dielectric, a single diffusion break isolation region disposed between the adjacent device source-drain regions. The outer metal liner is disposed in electrical contact with the adjacent device source-drain regions.

9 Claims, 22 Drawing Sheets

ON-CHIP DECOUPLING CAPACITOR

BACKGROUND

The disclosure relates generally to on-chip decoupling capacitors. The disclosure relates particularly to front-end-of-line, decoupled capacitors integrated with CMOS chip elements.

Decoupling capacitors in complementary metal-oxide semiconductor (CMOS) devices provide a mechanism to electrically decouple respective device circuits. Electrical noise generated by one device circuit is shunted through a decoupling capacitor reducing the impact of the noise on the remaining device circuits.

Diffusion breaks are used to separate individual circuit elements, such as transistors, from each other by creating an isolating break in device fins upon which the circuit elements are built. the isolating break creates an electrically insulated area preventing current flow between the separated devices. A single diffusion break (SBD) is a diffusion break between device elements occupying a single device-gate-width on the affected fin.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

In one aspect, a semiconductor device includes a decoupling capacitor disposed between adjacent device source-drain regions, the decoupling capacitor comprising an outer metal liner, a dielectric disposed adjacent to the outer metal liner, and an inner metal liner disposed adjacent to the dielectric, a single diffusion break isolation region disposed between the adjacent device source-drain regions. The outer metal liner is disposed in electrical contact with the adjacent device source-drain regions.

In one aspect, a method of fabricating a semiconductor device includes forming at least two cavities though a single dummy gate structure and underlying device fins, laterally etching the device fins beneath adjacent gate spacers, disposing a metal liner within each cavity, disposing a sacrificial material adjacent to the metal liner within each cavity, removing the metal liner and sacrificial material from a first cavity, disposing a dielectric material in the first cavity, removing device dummy gate structures, disposing a dielectric liner material upon exposed device surfaces of a second cavity, disposing gate metal material upon the dielectric liner material in the second cavity.

In one aspect, a method of fabricating a semiconductor device includes forming at least two cavities though a single dummy gate structure and underlying device fins, disposing a metal liner within each cavity, disposing a sacrificial material adjacent to the metal liner, removing the metal liner and sacrificial material from a first cavity, disposing a dielectric material in the first cavity, removing device dummy gate structures, disposing a dielectric liner material upon exposed device surfaces of a second cavity, disposing gate metal material upon the dielectric liner material in the second cavity, and forming a device source-drain contact between device source-drain epitaxial regions and the metal liner.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Figure 1:
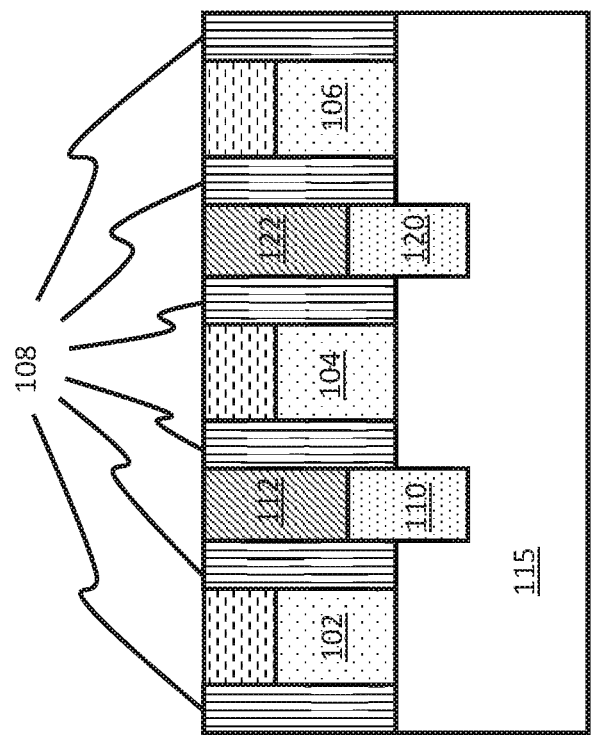
FIG. 1 provides a cross-sectional view of a step in the fabrication of a semiconductor device, according to an embodiment of the invention. The figure illustrates the device after the formation of dummy gate structures and before the formation of the decoupling capacitor and single diffusion break.
Figure 1:
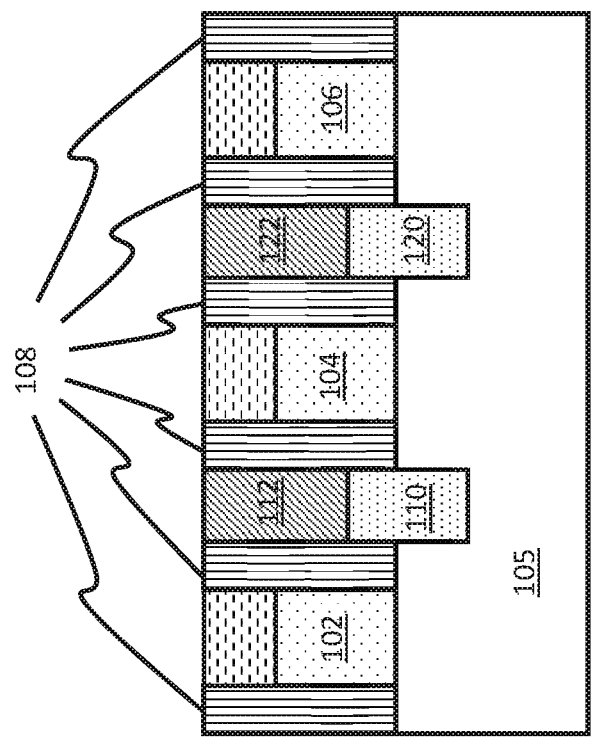

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Device decoupling capacitors provide a mechanism to prevent circuit noise from impacting all device circuits. Noise from circuits coupled to the capacitor is shunted to the capacitor and does not pass to other circuits. The use of planar metal oxide semiconductor capacitors can consume a significant amount of device chip area and result in capacitors which are not located close to the circuits to which they are coupled for noise reduction. This disclosure includes devices and methods of fabrication for device decoupling capacitors occupying a small area—that of a single diffusion break—and fabricated during front-end-of-line processes rather than added as a back-end-of-line manufacturing step. The disclosed structures are compatible with nanosheet CMOS devices and fabrication methods.

The disclosed devices and fabrication methods relate to CMOS devices which include on-chip decoupling capacitors having a small—single gate width-footprint, using otherwise unused space and enabling higher density chip architectures. The decoupling capacitors are formed together with single diffusion breaks under a common dummy gate structure providing a means to integrate the capacitors into the devices without requiring significant chip area. In an embodiment, the decoupling capacitor and single diffusion break each include an airgap to assist in achieving the desired capacitance and electrical isolation associated with the respective chip elements.

Reference is now made to the figures to describe embodiments of the invention. The figures are exemplary in nature and are not intended to illustrate the invention to scale. FIG. 1 provides an illustration of a cross-section of a device at an intermediate stage of fabrication. As shown in the figure, the device includes fins 105 and 115. Fins 105 and 115 are parallel fin elements sharing dummy gate and hard mask structures 102, 104, and 106, as well as device source drain regions 110 and 120 capped by inter-layer dielectric (ILD) 112 and 122. Gate sidewall spacers 108 separate the dummy gate hard mask structures 102, 104, and 106 from source-drain regions 110 and 120.

Figure 2:
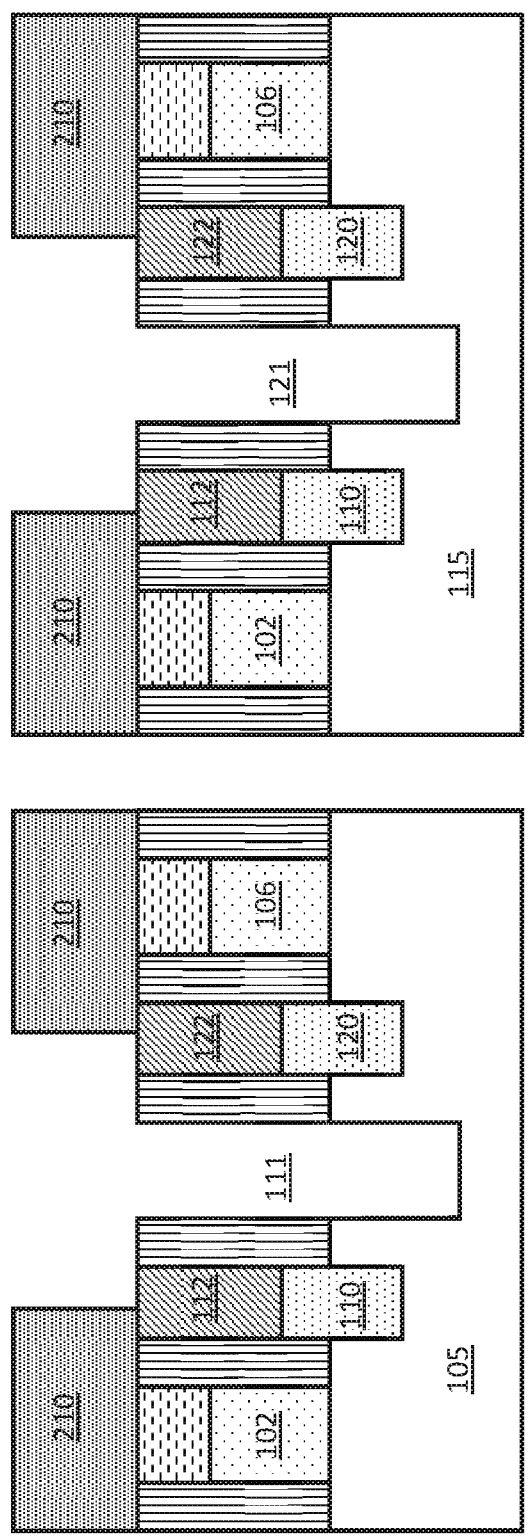
FIG. 2 provides a cross-sectional view of a step in the fabrication of a semiconductor device, according to an embodiment of the invention. The figure illustrates the device after the etching of cavities for the decoupling capacitor and the single diffusion break.

As shown in FIG. 2, application, followed by selective patterning and removal of material, such as an organic planarization layer (OPL) 210 material, protects portions of the device while decoupling capacitor and single diffusion break cavities 111, 121, are etched through dummy gate hard mask element 104 and the upper portions of crystalline Si fins 105 and 115, as preparation for the formation of the decoupling capacitor and single diffusion break cavities 111, 121. Exemplary etching methods include reactive ion etching (RIE) ion beam etching (IBE), and other known anisotropic etching methods.

Figure 3:
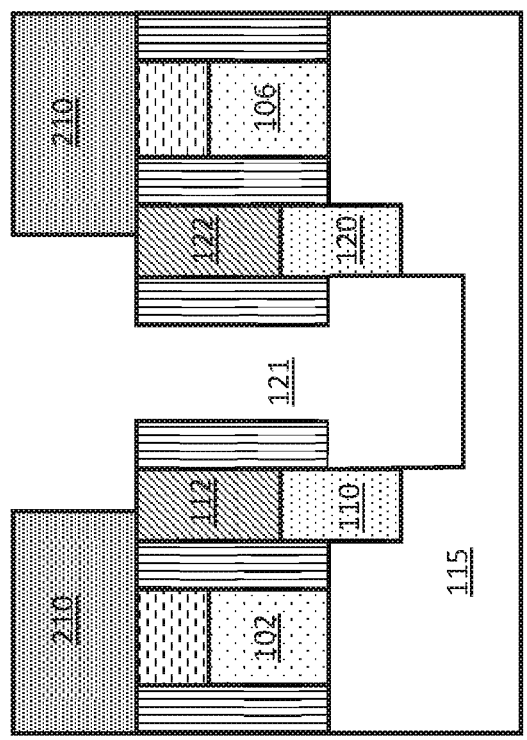
FIG. 3 provides a cross-sectional view of a step in the fabrication of a semiconductor device, according to an embodiment of the invention. The figure illustrates the device after the lateral etching of the decoupling capacitor and single diffusion break cavities.
Figure 3:
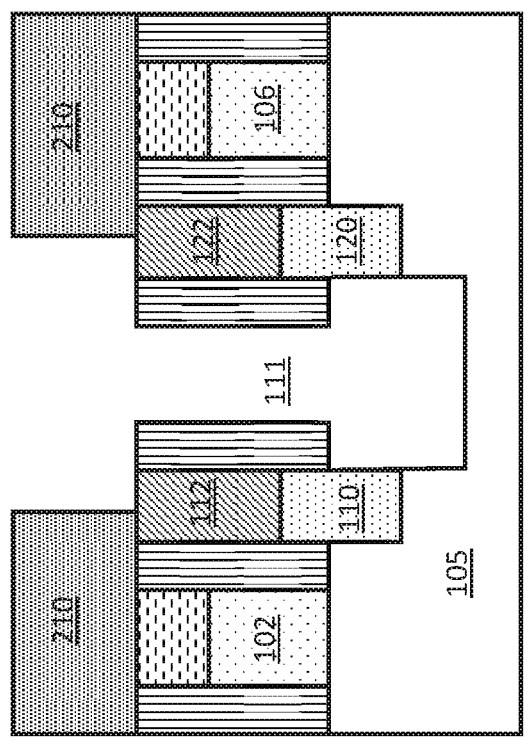

As shown in FIG. 3, etching of the crystalline Si of fins 105 and 115 continues laterally until the epitaxial regions 110 and 120 of the device are exposed in the respective cavity regions. Anisotropic etching of the vertical surfaces of the cavities 111, 121, exposes the epitaxial source-drain regions 110, 120, of the device.

Figure 4:
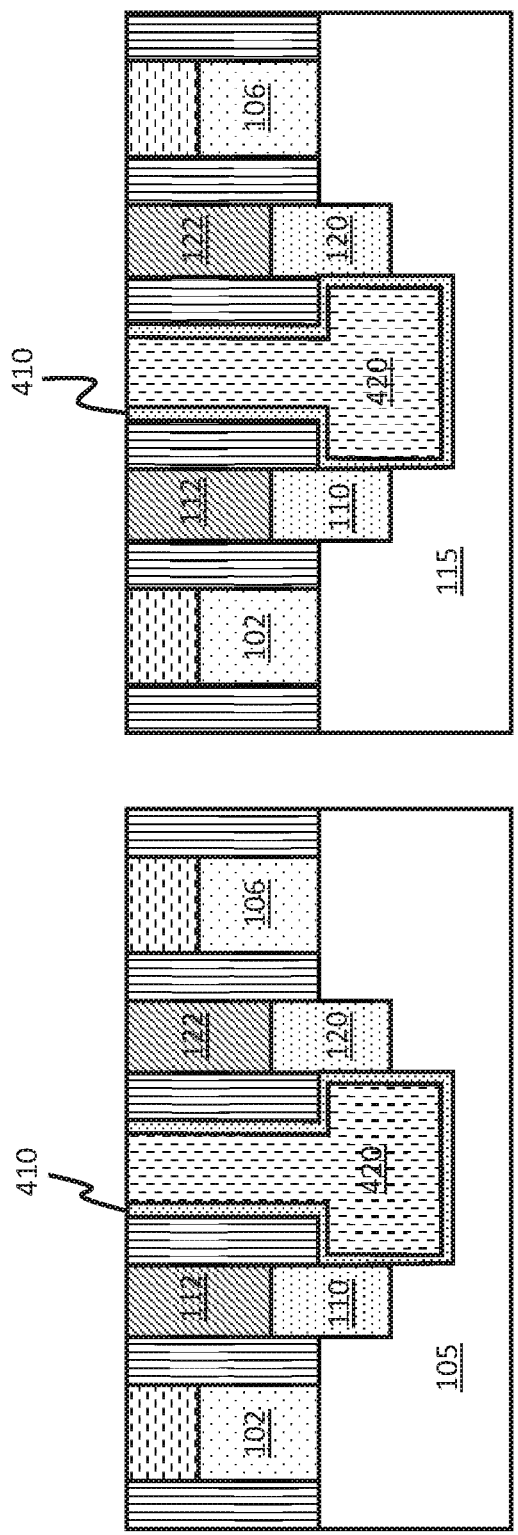
FIG. 4 provides a cross-sectional view, of a step in the fabrication of a semiconductor device, according to an embodiment of the invention. The figure illustrates the device after deposition of a metal liner layer and sacrificial material within the cavities.

As shown in FIG. 4, OPL 210 is removed using an ashing process. Deposition of a metal liner 410 and sacrificial material 420 fills each of the decoupling capacitor and single diffusion break cavities 111, 121. The metal liner includes a layer of material between about 3 nm and about 10 nm thick. Exemplary materials for the metal liner 410 include TiN, Ru, TiC, TiAl, TaN, W, Al, and similar materials. Exemplary materials for the sacrificial material 420 include amorphous Silicon (a-Si) and similar materials. Deposition processes for the metal liner 410 and sacrificial material 420 include, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 5:
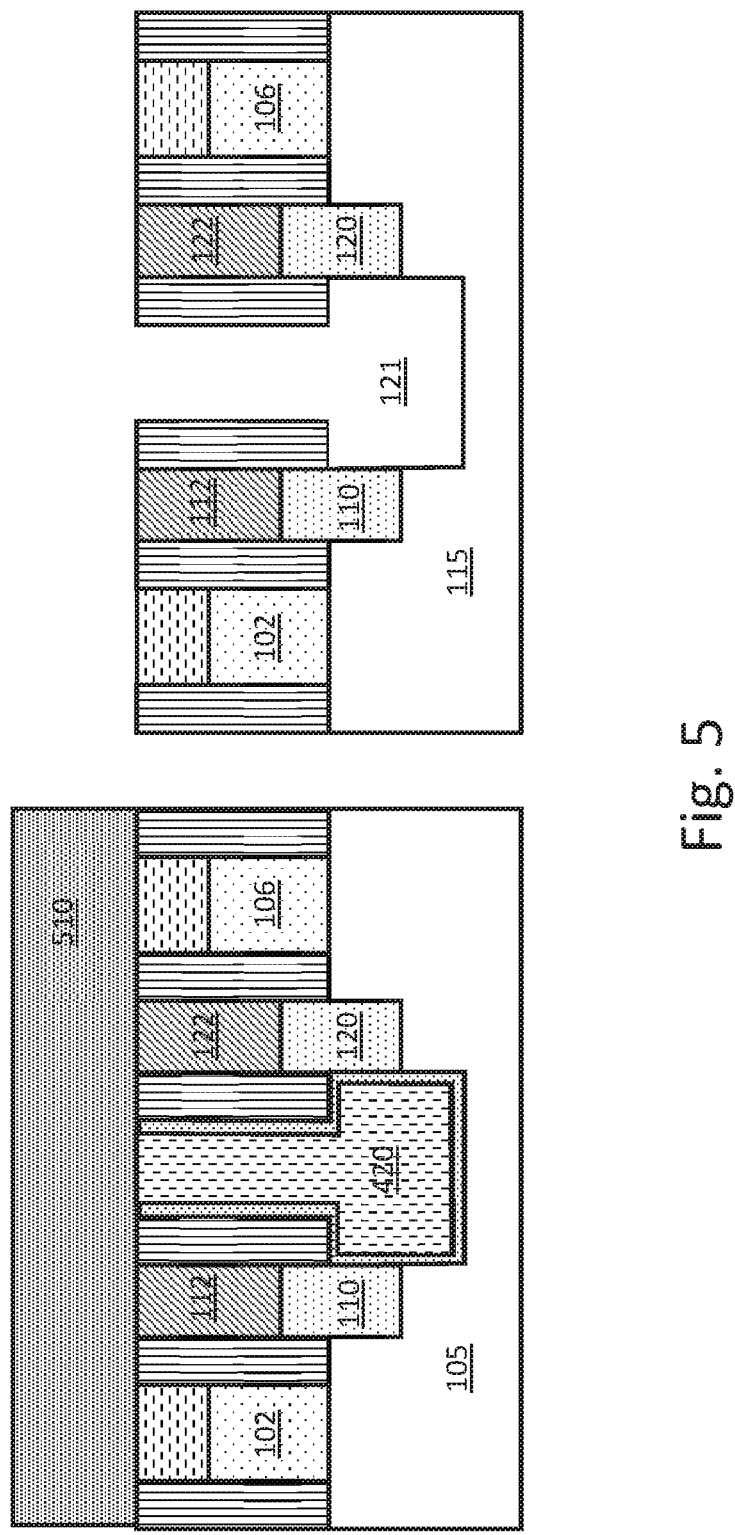
FIG. 5 provides a cross-sectional view of a step in the fabrication of a semiconductor device, according to an embodiment of the invention. The figure illustrates the device after the masking of the decoupling capacitor cavity and the removal of material from the single diffusion break cavity.

FIG. 5 illustrates the device after formation of patterned OPL 510 to mask and protect the decoupling capacitor 111 during the removal of the metal liner 410 and sacrificial material 420 from the single diffusion break cavity 121.

Figure 6:
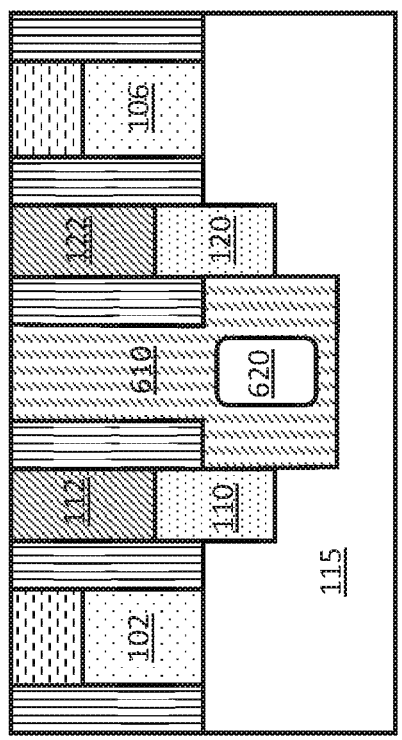
FIG. 6 provides a cross-sectional view of a step in the fabrication of a semiconductor device, according to an embodiment of the invention. The figure illustrates the device after the deposition of dielectric material in the single diffusion break cavity and the formation of an airgap in the dielectric.
Figure 6:
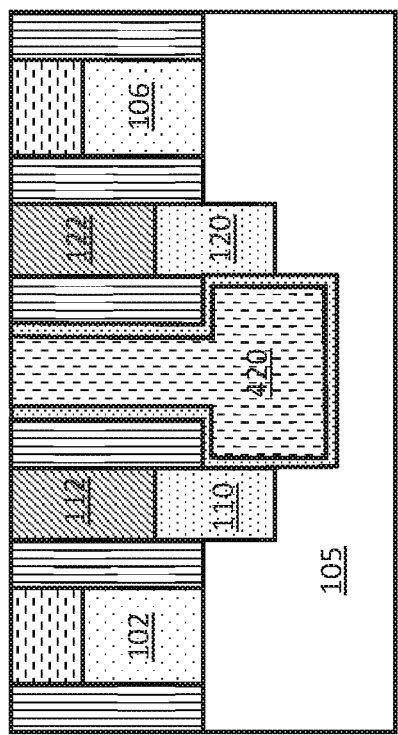

FIG. 6 provides an illustration of the device after ashing away the OPL 510 and deposition of dielectric material 610 in single diffusion break cavity 121. Suitable dielectric materials include silicon dioxide, or SiCO, or SiC or any another suitable dielectric material or combination disposed within the cavity 121 by deposition methods described above. In an embodiment, the deposition of the dielectric material 610 in the SDB cavity 111 includes the formation of an airgap 620 within the dielectric material 610.

In an embodiment, the cross section of the SDB cavity reflects that the lower portion of the cavity has a larger critical dimension than the upper portion of the cavity. As conformal deposition of the dielectric material 610 proceeds, the upper portion of the cavity becomes closed off before the lower portion becomes filled resulting in an airgap in the lower portion of the cavity.

Figure 7:
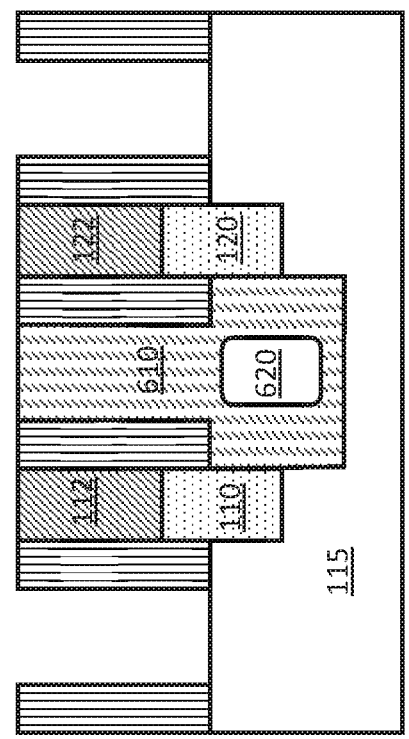
FIG. 7 provides a cross-sectional view of a step in the fabrication of a semiconductor device, according to an embodiment of the invention. The figure illustrates the device after the removal of the dummy gate structures and sacrificial material from the decoupling capacitor cavity.
Figure 7:
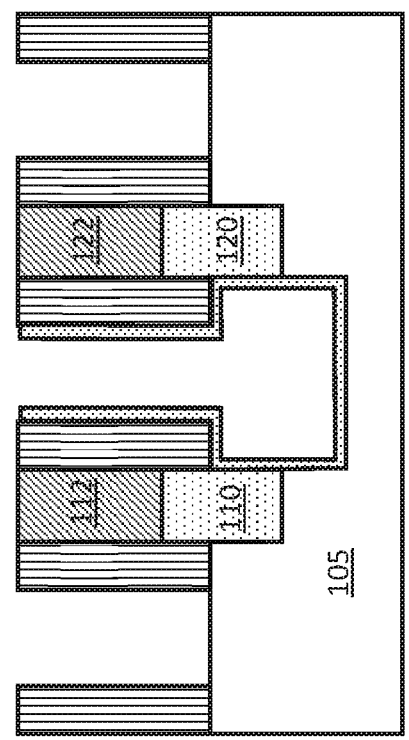

FIG. 7 illustrates the device after the selective etching away of dummy gate structures 102,106, and sacrificial material 420 from the decoupling capacitor cavity 111 using RIE, IBE or other suitable etching methods.

Figure 8:
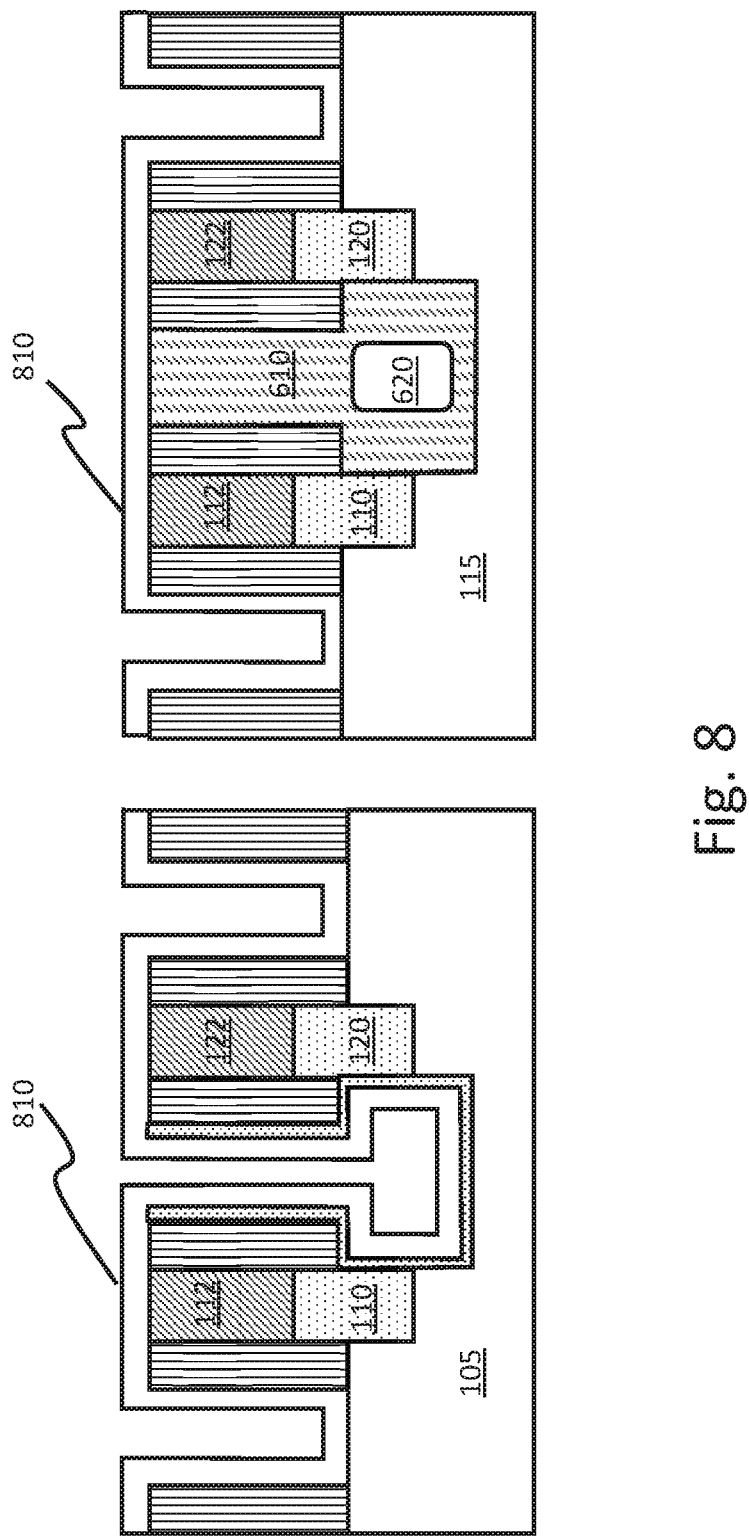
FIG. 8 provides a cross-sectional view of a step in the fabrication of a semiconductor device, according to an embodiment of the invention. The figure illustrates the device after the deposition of a dielectric liner material.

FIG. 8 illustrates the device after deposition of a dielectric liner material 810, such as $HfO_2$, or similar materials, upon the exposed surfaces of the device including the exposed surfaces of the decoupling capacitor cavity 111. Deposition of the dielectric liner material proceeds using ALD, CVD, PVD or other deposition methods as described above. In an embodiment, the dielectric liner material layer 810 has a thickness of between about 1 nm and about 3 nm.

Figure 9:
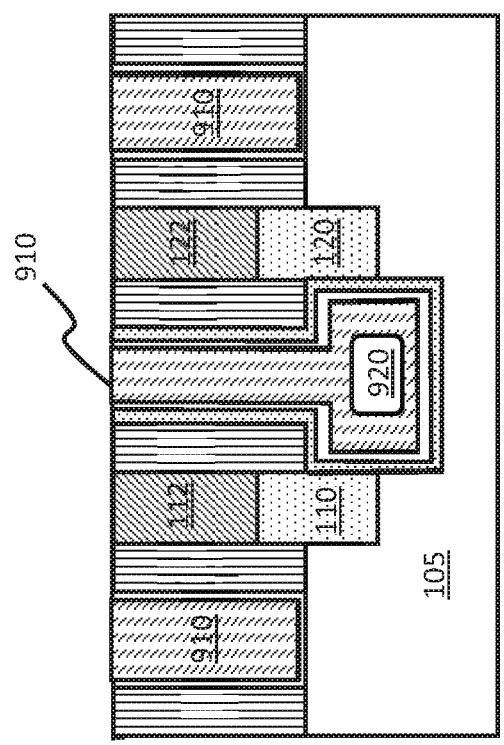
FIG. 9 provides a cross-sectional view of a step in the fabrication of a semiconductor device, according to an embodiment of the invention. The figure illustrates the device after the deposition of gate metal material.
Figure 9:
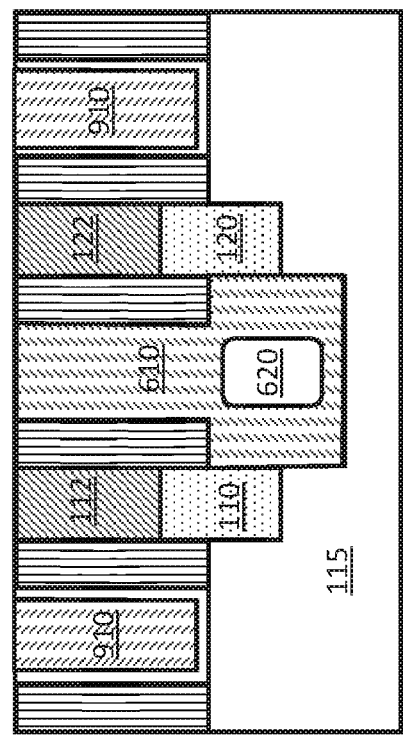

FIG. 9 illustrates the device after the formation of the gates by the deposition of gate metal 910. Deposition of gate metal 910 in decoupling capacitor cavity 111 followed by one or more chemical-mechanical planarization (CMP) processes to trim the gate metal material and remove the dielectric liner material to the upper surfaces of the gate sidewall spacers, SDB, and decoupling capacitor, completes the formation of the capacitor as well. Exemplary gate metal materials include work function metal materials and low resistance metals such as TiN, TiAlC, TiC, TaN, W, Al, and similar materials. In an embodiment, deposition of gate metal 910 in the decoupling capacitor cavity 111 includes the formation of an airgap 920 in the gate metal of the capacitor. The decoupling capacitor cavity 111 cross section includes a larger space at the bottom of a relatively narrow access channel. Conformal deposition of the gate metal material closes the access channel before completely filling the lower portion of the cavity, resulting in the airgap in the lower portion of the cavity.

Figure 10:
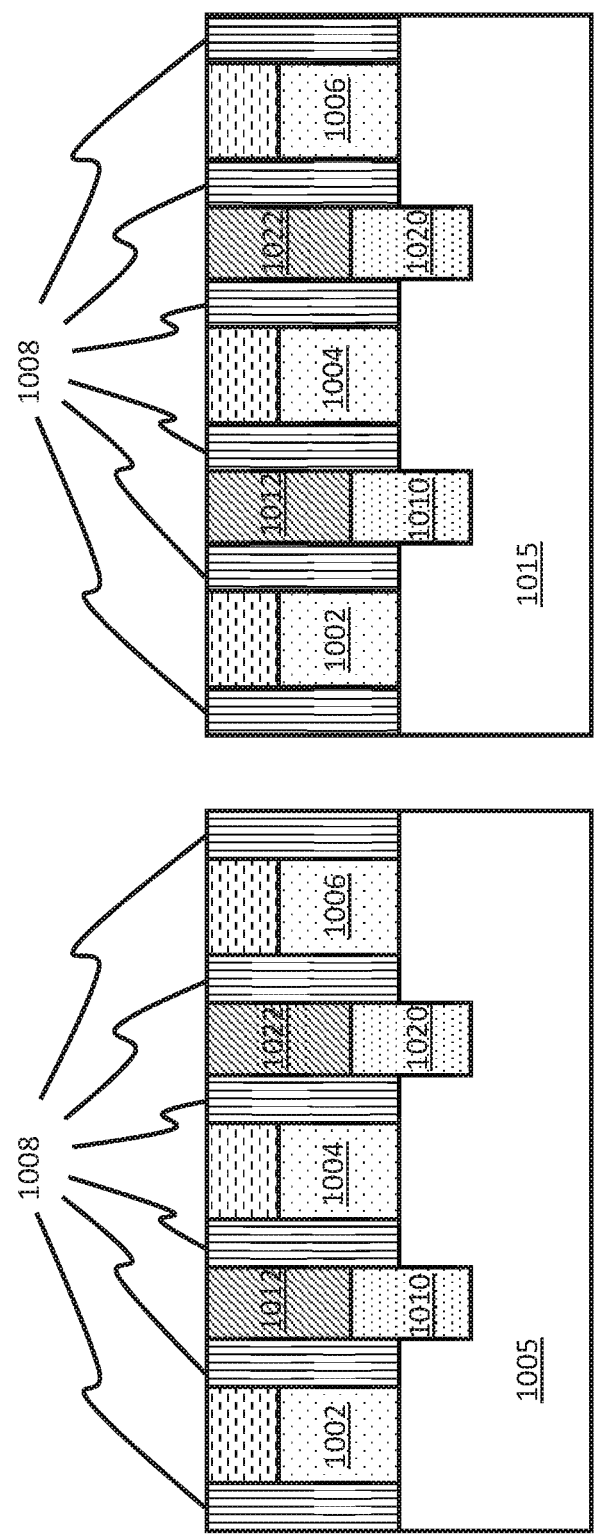
FIG. 10 provides a cross-sectional view of a step in the fabrication of a semiconductor device, according to an embodiment of the invention. The figure illustrates the device after the formation of dummy gate structures and before the formation of the decoupling capacitor and single diffusion break.

In an embodiment, the fabrication of the device proceeds as illustrated in FIGS. 10-20. FIG. 10 provides an illustration of a cross-section of a device at an intermediate stage of fabrication. As shown in the figure, the device includes fins 1005 and 1015. Fins 1005 and 1015 are parallel fin elements sharing dummy gate and hard mask structures 1002, 1004, and 1006, as well as device source drain regions 1010 and 1020 capped by ILD 1012 and 1022. Gate sidewall spacers 1008 separate the dummy gate hard mask structures 1002, 1004, and 1006 from source-drain regions 1010, and 1020.

Figure 11:
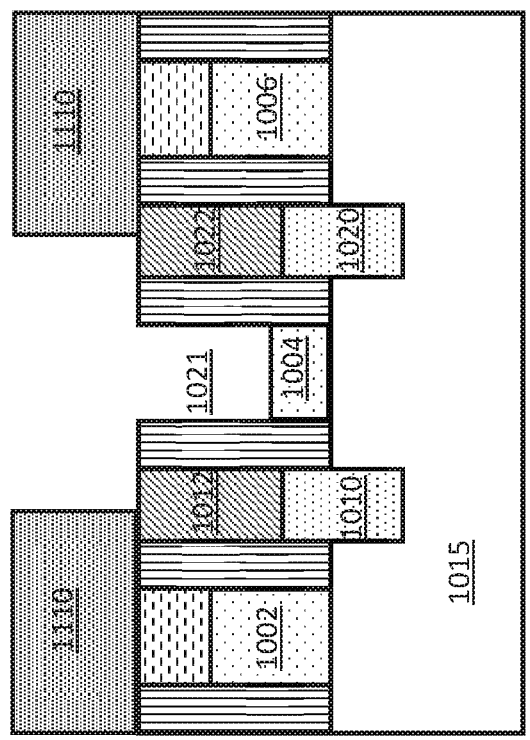
FIG. 11 provides a cross-sectional view of a step in the fabrication of a semiconductor device, according to an embodiment of the invention. The figure illustrates the device after patterning and etching initial cavities for the decoupling capacitor and single diffusion break.
Figure 11:
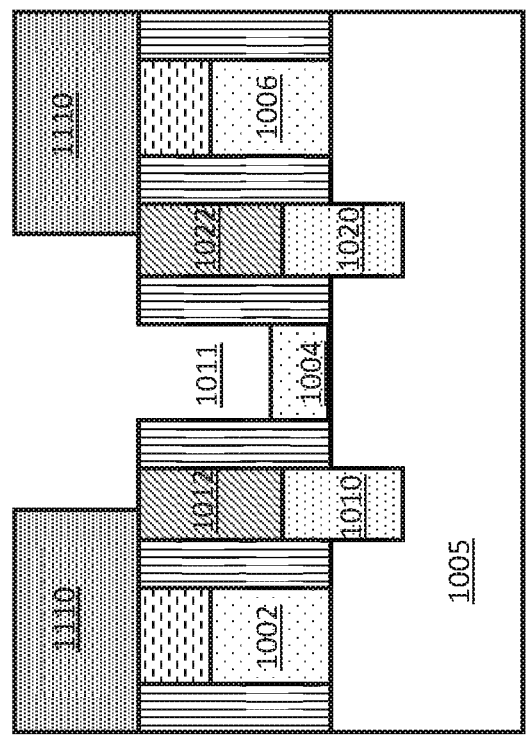

As shown in FIG. 11, patterned OPL material protects portions of the device while decoupling capacitor and single diffusion break cavities 1011, 1021, are etched through the hard mask and partially through dummy gate element 1004, as preparation for the formation of the decoupling capacitor and single diffusion break. Exemplary etching methods include reactive ion etching (RIE) ion beam etching (IBE), and other known anisotropic etching methods.

Figure 12:
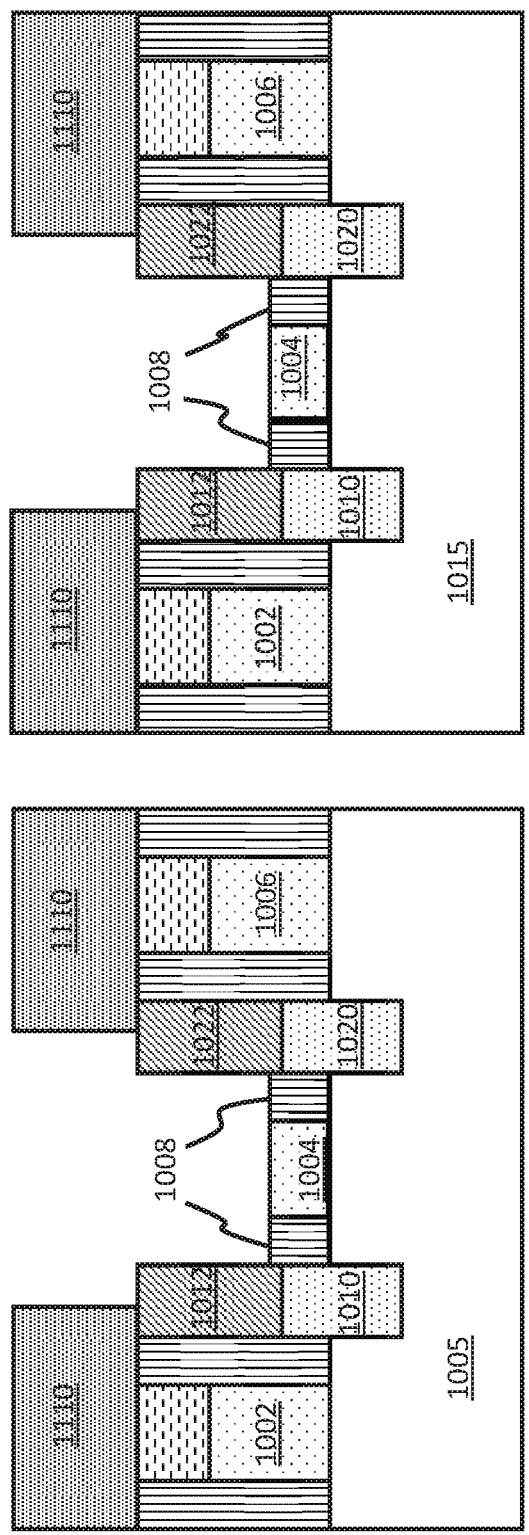
FIG. 12 provides a cross-sectional view of a step in the fabrication of a semiconductor device, according to an embodiment of the invention. The figure illustrates the device after the etching of gate sidewall spacers.

As shown in FIG. 12, portions of sidewall spacers 1008 are removed to the upper surface of the remaining portion of the dummy gate element 1004. Anisotropic etching to remove material from the vertical walls of the cavity are used to remove the spacer portions.

Figure 13:
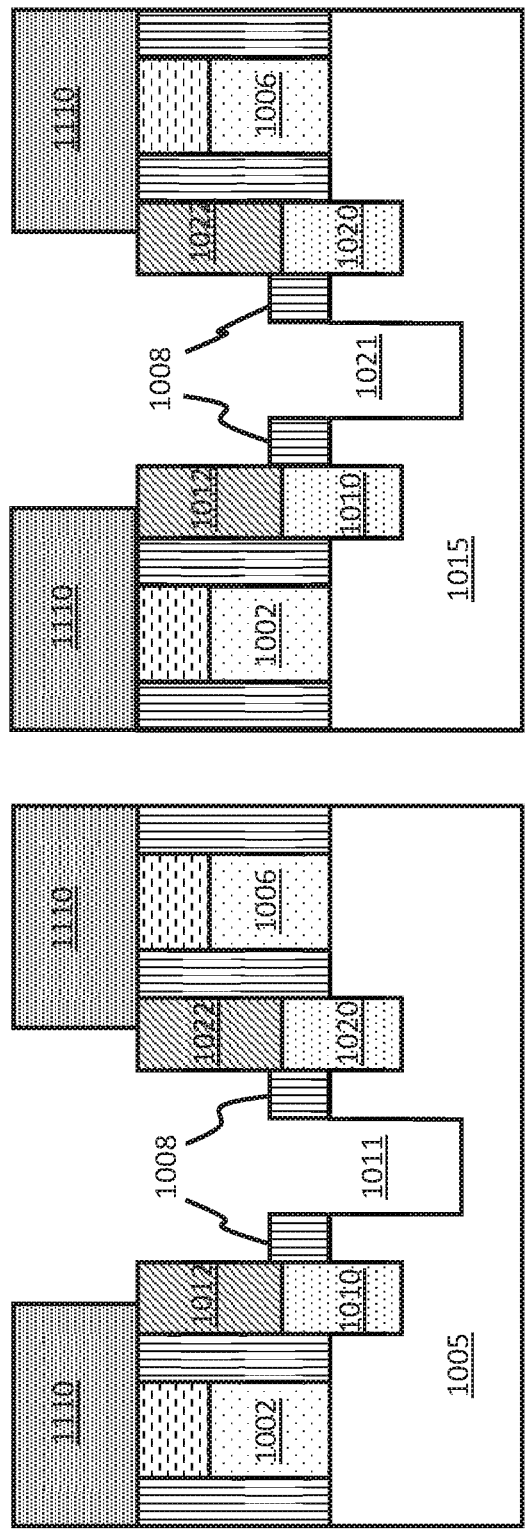
FIG. 13 provides a cross-sectional view of a step in the fabrication of a semiconductor device, according to an embodiment of the invention. The figure illustrates the device after further etching of the decoupling and single diffusion break cavities.

As shown in FIG. 13, etching of the decoupling capacitor cavity 1011 and SDB cavity 1021, continues through the remaining portion of the dummy gate element 1004 and fins 1005 and 1015, using RIE.

Figure 14:
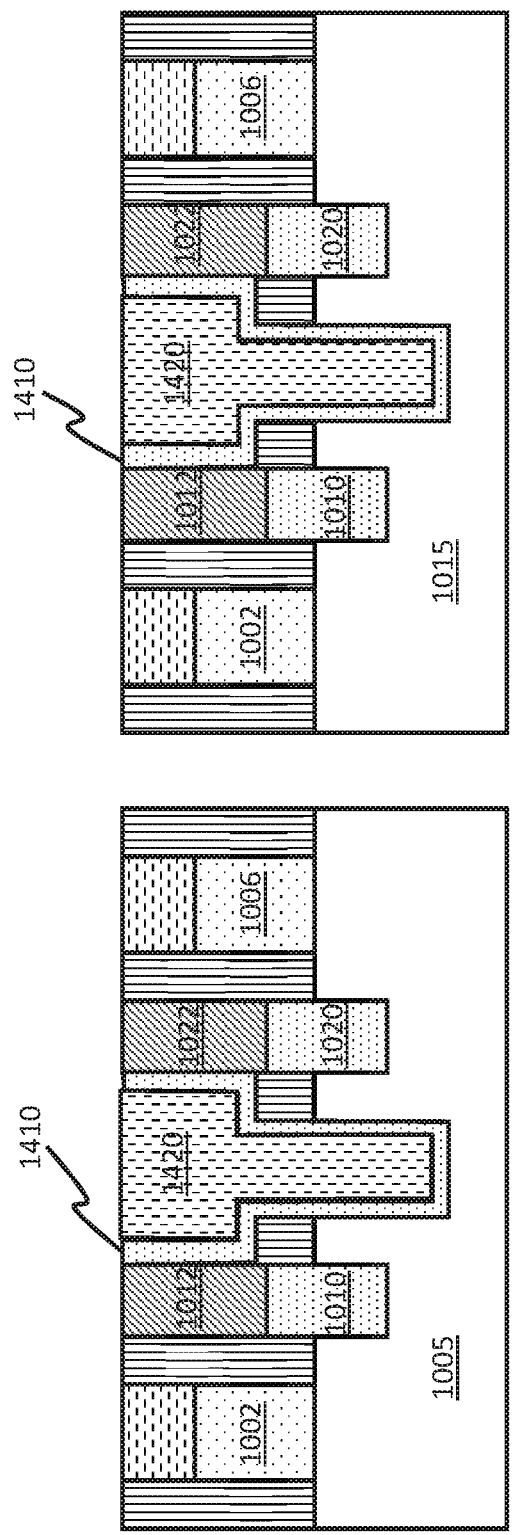
FIG. 14 provides a cross-sectional view of a step in the fabrication of a semiconductor device, according to an embodiment of the invention. The figure illustrates the device after the deposition of metal liner and sacrificial material layers in the decoupling capacitor and single diffusion break cavities.

FIG. 14 illustrates the device after OPL 1110 removal by ashing, and deposition of a metal liner 1410 and sacrificial material 1420 to fill each of the decoupling capacitor and single diffusion break cavities 1011, 1021. The metal liner includes a layer of material between about 3 nm and about 10 nm thick. Exemplary materials for the metal liner 1410 include TiN, Ru, TiC, TiAl, TaN, W, Al, and similar materials. Exemplary materials for the sacrificial material 1420 include amorphous Silicon (a-Si) and similar materials. Deposition processes for the metal liner 1410 and sacrificial material 1420 include, e.g., CVD, PVD, ALD, or GCIB deposition.

Figure 15:
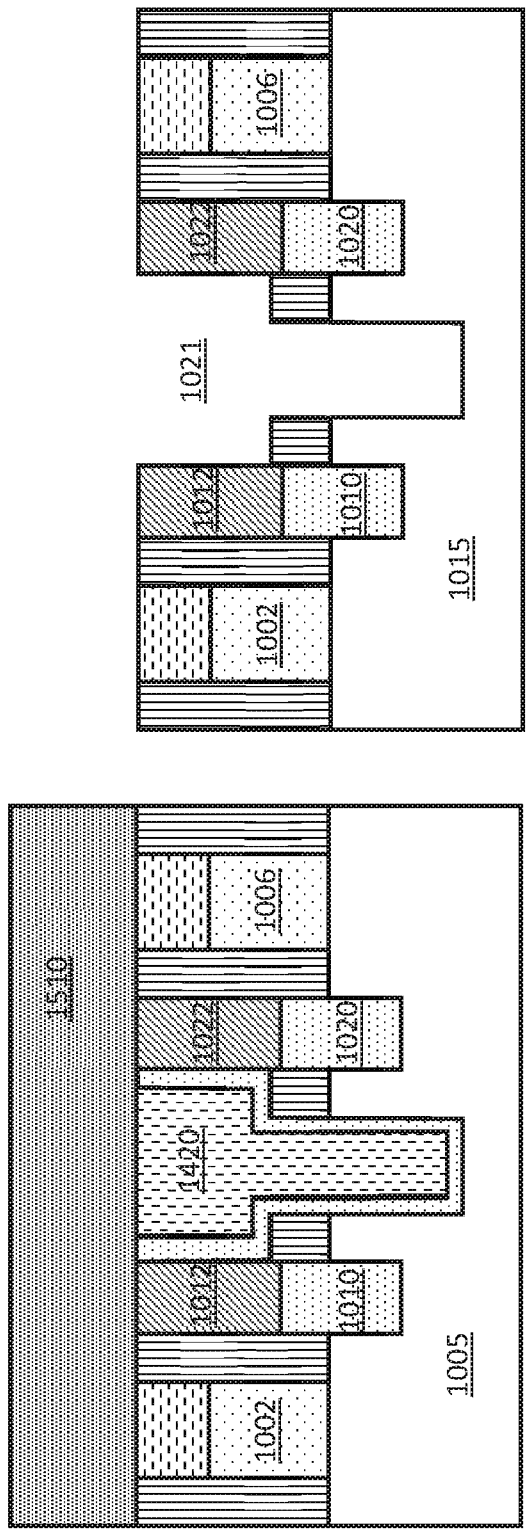
FIG. 15 provides a cross-sectional view of a step in the fabrication of a semiconductor device, according to an embodiment of the invention. The figure illustrates the device after the masking of the decoupling capacitor cavity and the removal of material from the single diffusion break cavity.

FIG. 15 illustrates the device after formation of patterned OPL 1510 to mask and protect the decoupling capacitor cavity 1011 during the removal of the metal liner 1410 and sacrificial material 1420 from the single diffusion break cavity 1021.

Figure 16:
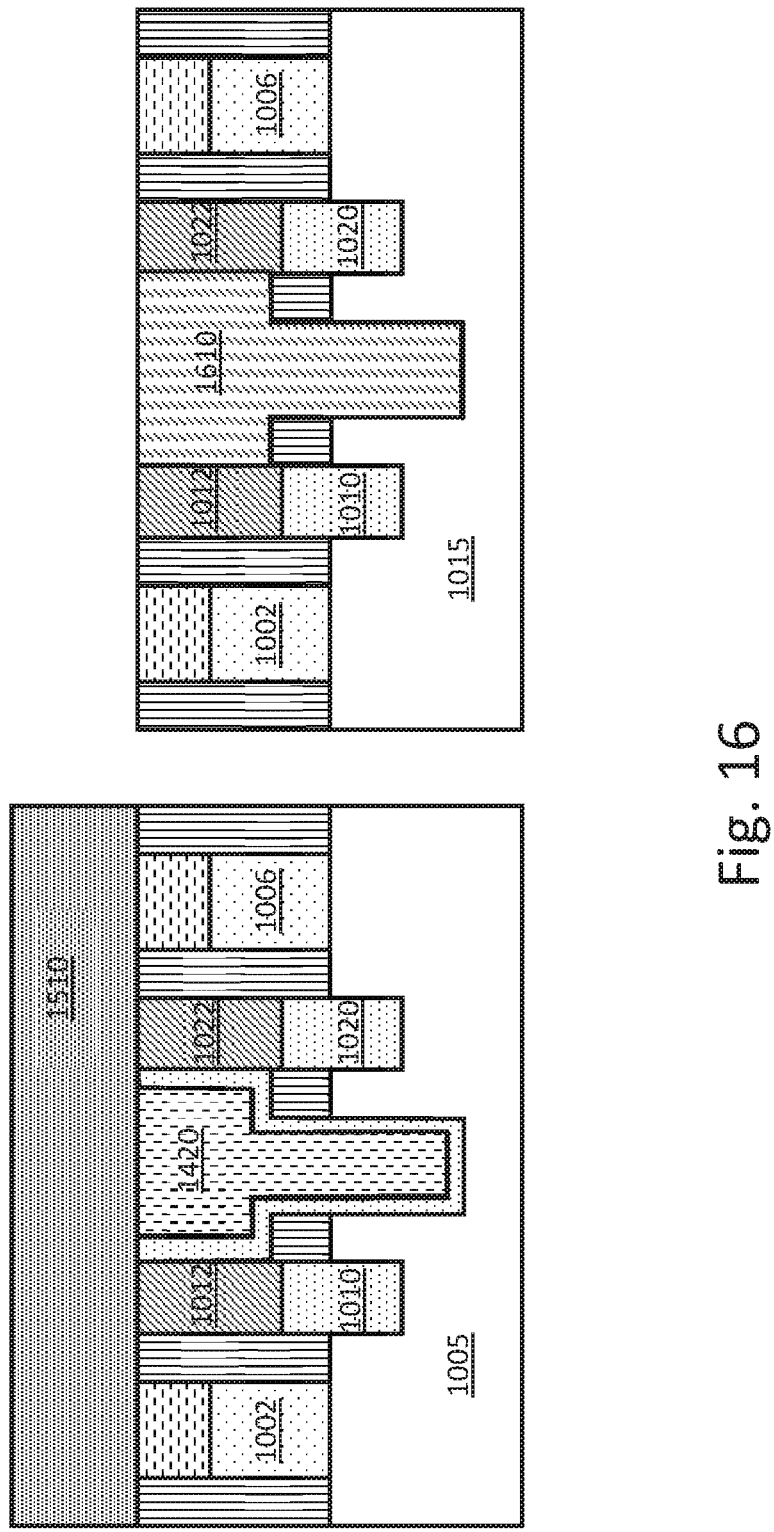
FIG. 16 provides a cross-sectional view of a step in the fabrication of a semiconductor device, according to an embodiment of the invention. The figure illustrates the device after the deposition of dielectric material in the single diffusion break cavity.

FIG. 16 provides an illustration of the device after deposition of dielectric material 1610 in single diffusion break cavity 1021. Suitable dielectric materials include silicon dioxide, or SiCO, or SiC or any another suitable dielectric material or combination disposed within the cavity 1021 by deposition methods described above.

Figure 17:
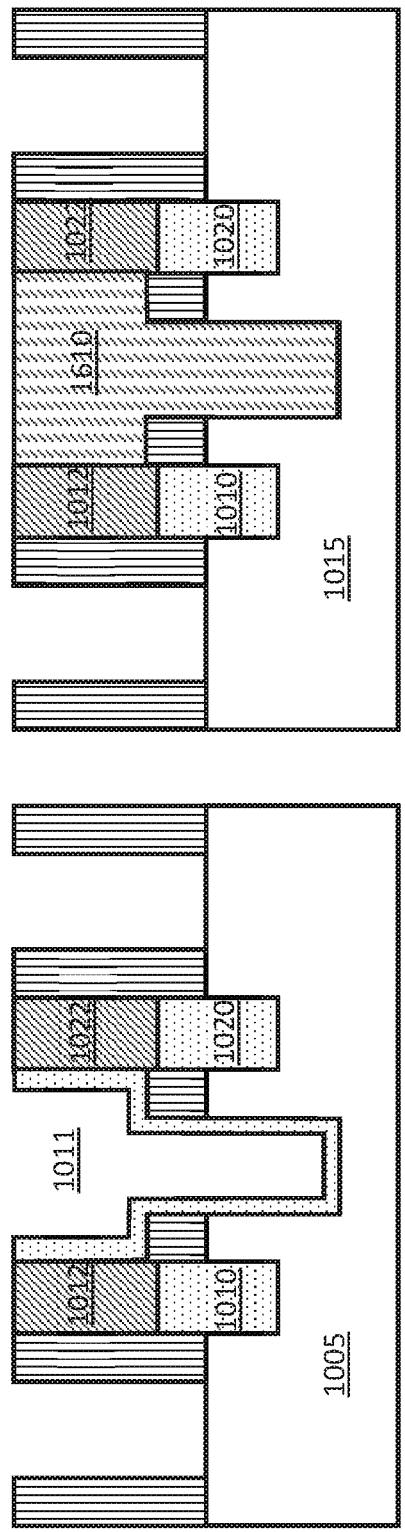
FIG. 17 provides a cross-sectional view of a step in the fabrication of a semiconductor device, according to an embodiment of the invention. The figure illustrates the device after removal of dummy gate structures and the sacrificial material layer form the decoupling capacitor cavity.

FIG. 17 illustrates the device after the removal of OPL 1510 by ashing or similar processes and the selective etching away of dummy gate structures 1002, 1006, and sacrificial material 1420 from the decoupling capacitor cavity 1011 using RIE, IBE or other suitable etching methods.

Figure 18:
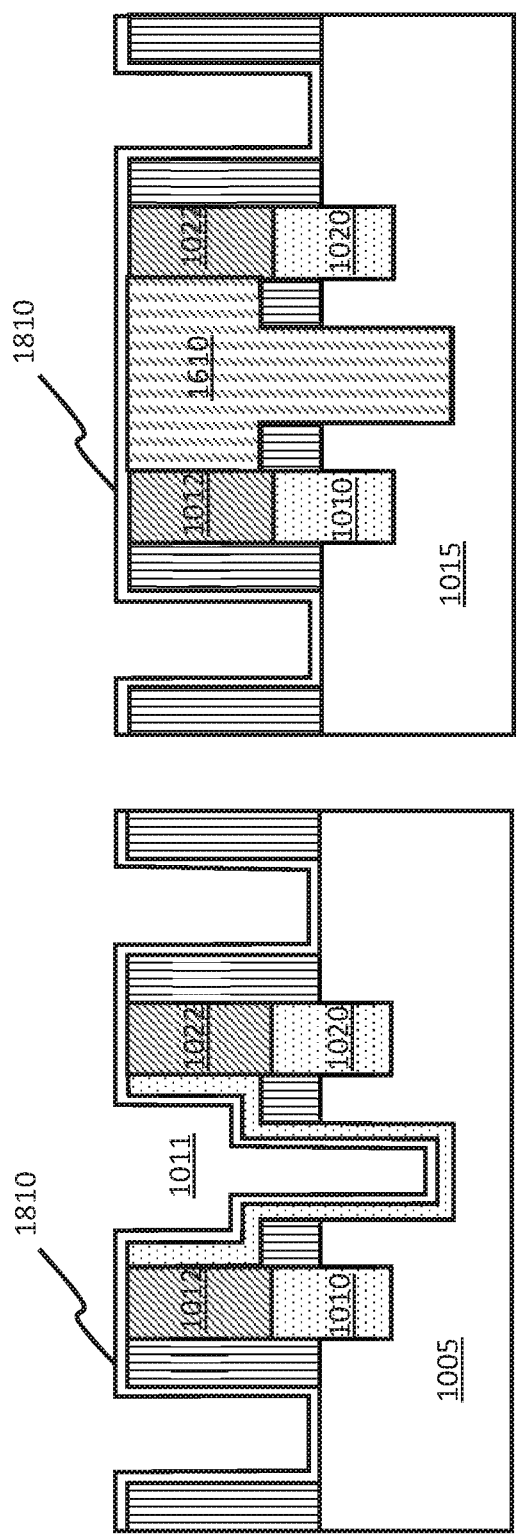
FIG. 18 provides a cross-sectional view of a step in the fabrication of a semiconductor device, according to an embodiment of the invention. The figure illustrates the device after the deposition of a dielectric liner material layer.

FIG. 18 illustrates the device after deposition of a dielectric liner material 1810, such as $HfO_2$, or similar materials, upon the exposed surfaces of the device including the exposed surfaces of the decoupling capacitor cavity 1011. Deposition of the dielectric proceeds using ALD, CVD, PVD or other deposition methods as described above. In an embodiment, the dielectric liner material layer 1810 has a thickness of between about 1 nm and about 3 nm.

Figure 19:
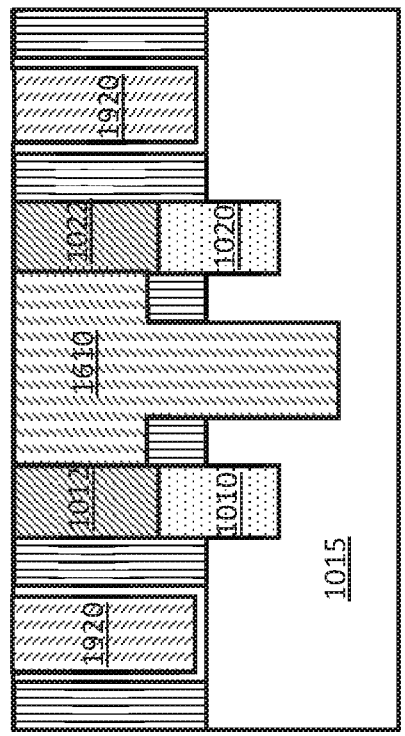
FIG. 19 provides a cross-sectional view of a step in the fabrication of a semiconductor device, according to an embodiment of the invention. The figure illustrates the device after the deposition of gate metal material.
Figure 19:
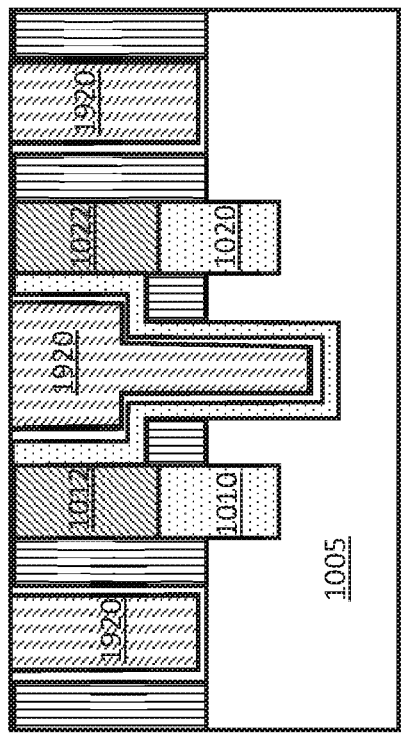

FIG. 19 illustrates the device after the formation of the gates by the deposition of gate metal 1920. Deposition of gate metal 1920 in decoupling capacitor cavity 1011 followed by one or more CMP processes to trim the gate metal material and remove the dielectric liner material to the upper surfaces of the gate sidewall spacers, SDB, and decoupling capacitor, completes the formation of the capacitor as well. Exemplary gate metal materials include work function metal materials and low resistance metals such as TiN, TiAlC, TiC, TaN, W, Al, and similar materials. In this embodiment, each of the SDB and decoupling capacitor has a T-shaped cross section, formed above the gate sidewall spacers and extending into the device fins.

Figure 20:
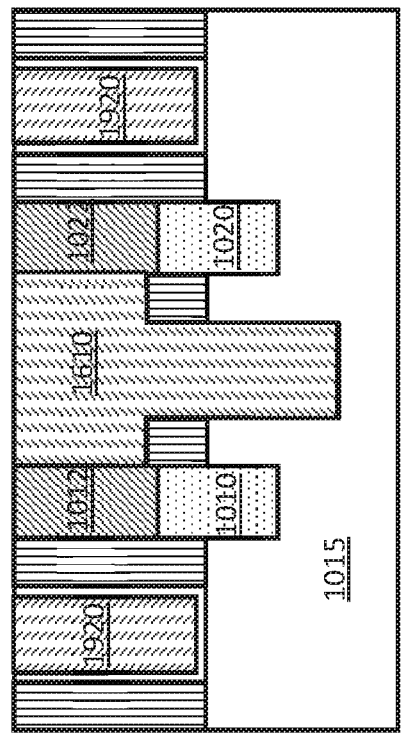
FIG. 20 provides a cross-sectional view of a step in the fabrication of a semiconductor device, according to an embodiment of the invention. The figure illustrates the device after the formation of a conductive contact between the decoupling capacitor and a device source-drain region.
Figure 20:
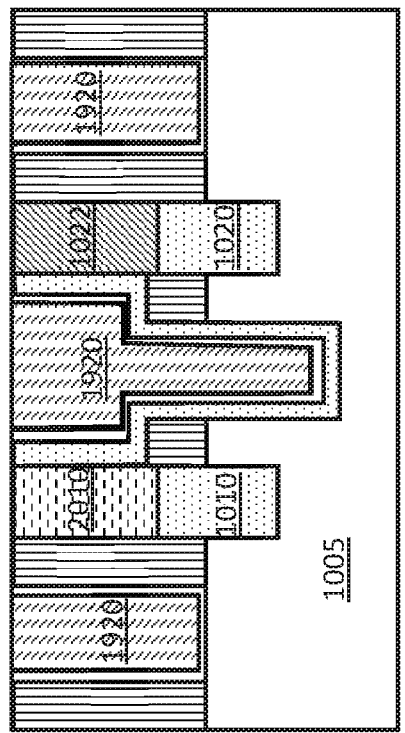

FIG. 20 illustrates the device after the selective patterning and removal of ILD material 1020 from above epitaxial source drain region 1010 of the device, followed by the formation of a trench silicide metalized contact 2010 providing electrical communication between the epitaxial region 1010 and the decoupling capacitor metal liner 1410.

Figure 21:
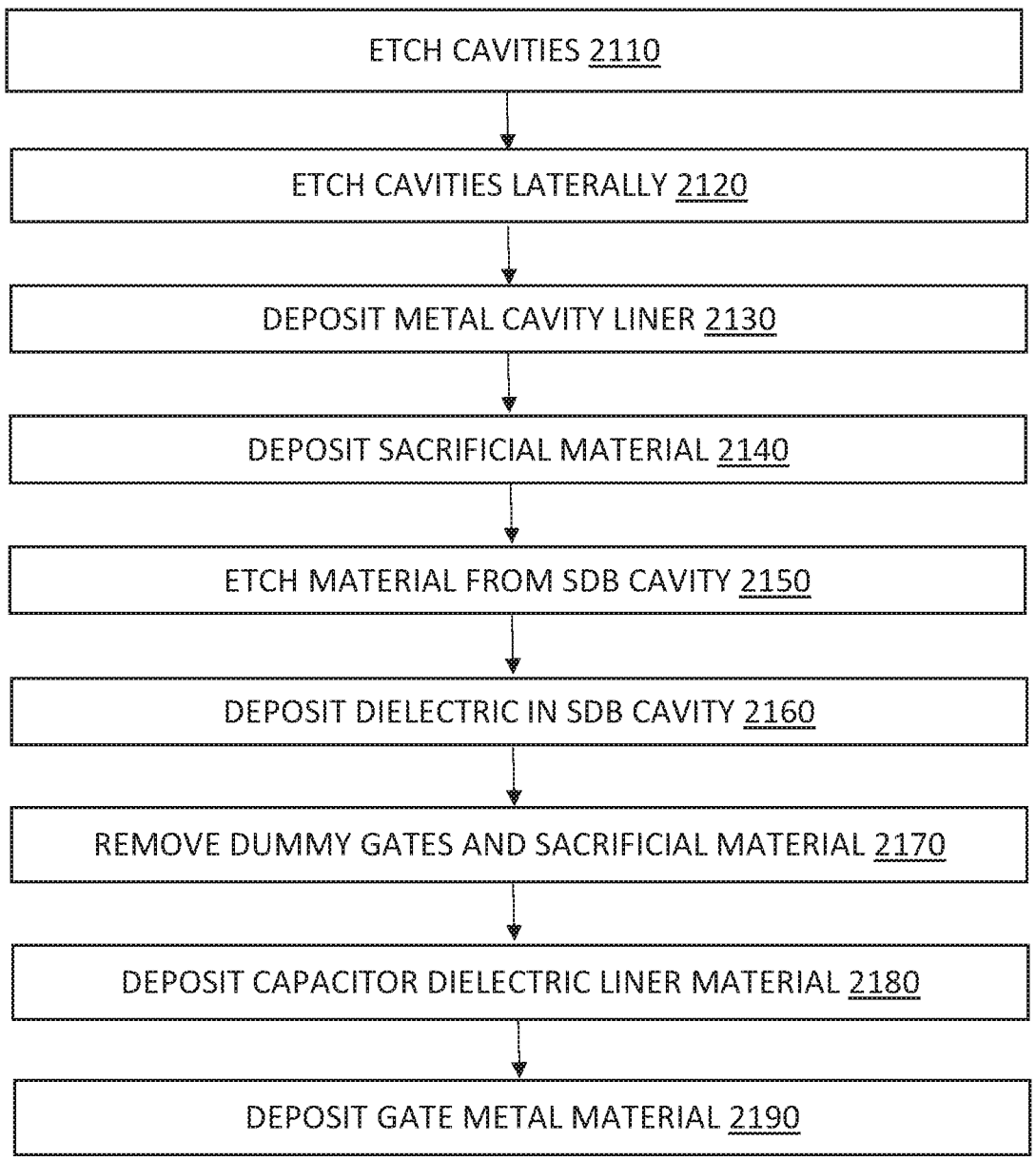
FIG. 21 provides a flowchart depicting operational steps for forming semiconductor device, according to an embodiment of the invention.

FIG. 21 illustrates flowchart 2100 depicting fabrication steps of the formation of devices according to an embodiment of the invention, following the stages of formation illustrated in FIGS. 2-9. At block 2110 (FIG. 2), deposition and patterned masking and removal of a material such as OPL upon the device enables the etching of at least two cavities through portions of a hard mask layer, the underlying dummy gate layer and one device fin per cavity. The set of cavities are etched into a single dummy gate structure but multiple respective fins. At block 2120 (FIG. 3), anisotropic etching of the vertical surfaces of the fins yields cavities etched to expose epitaxial portions of the source-drain regions of the adjacent devices.

At block 2130 (FIG. 4), a metal liner layer, such as TiN, is disposed upon the surfaces of the etched cavities. Deposition methods such as ALD, CVD and PVD are used to deposit the metal liner layer.

At block 2140 (FIG. 4), after removal of any remaining masking material, such as the removal of remaining OPL by ashing, deposition of a sacrificial material such as a-Si into the cavities upon the TiN, by CVD, PVD or other deposition methods occurs. At block 2150 (FIG. 5), application and patterned masking and removal of a material, such as OPL, protects the decoupling capacitor cavity while exposing the SDB cavity, enabling the etching away of the sacrificial material and metal liner layer disposed in the SDB cavity. At block 2160 (FIG. 6), deposition of a dielectric material such as SiN, together with the formation of an airgap in the lower portion of the dielectric, occurs. In an embodiment, deposition of the dielectric material fills the relatively narrow upper portion of the cavity before the lower portion completely fills, closing off the incompletely filled lower portion, resulting in an air gap in the lower portion.

At block 2170 (FIG. 7), the device dummy gate structures and the sacrificial material disposed in the decoupling capacitor cavity is etched away by RIE or similar means. At block 2180 (FIG. 8), a dielectric liner material, such as HfO₂ or similar, is disposed upon the surfaces of the device using ALD or similar methods. At block 2190 (FIG. 9), deposition of gate metal material upon the dielectric liner material, followed by one or more CMP processes to trim the gate metal material and remove the dielectric liner material to the upper surfaces of the gate sidewall spacers, SDB, and decoupling capacitor, completes the device structures and the decoupling capacitor. In an embodiment, the deposition of gate metal for the decoupling capacitor includes the formation of an airgap in the lower portion of the gate metal, formed as described above.

Figure 22:
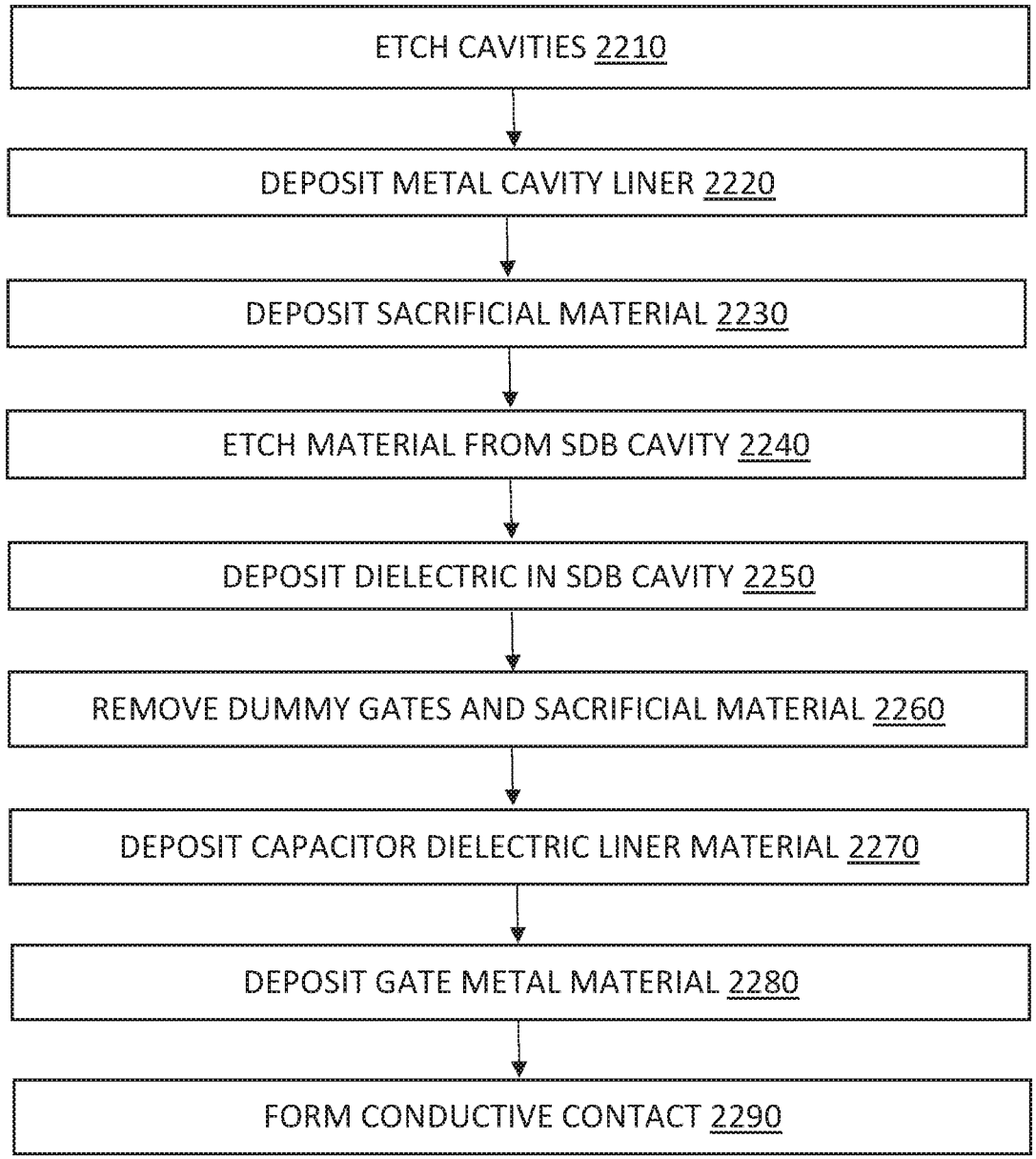
FIG. 22 provides a flowchart depicting operational steps for forming semiconductor device, according to an embodiment of the invention.

FIG. 22 illustrates flowchart 2200 depicting fabrication steps in the formation of devices according to an embodiment of the invention, following the stages illustrated in FIGS. 11-20. At block 2210 (FIG. 11), deposition and patterned masking and removal of a material such as OPL upon the device enables the etching of at least two cavities through portions of a hard mask layer, the underlying dummy gate layer and one device fin per cavity. One cavity for the formation of an SDB between adjacent device elements, and one cavity for the formation of a decoupling capacitor between adjacent device elements. The set of cavities are etched into a single dummy gate structure. After the initial etching, gate sidewall spacers in the cavities are etched away using anisotropic etching (FIG. 12). The cavities are then further etched through the remainder of the dummy gate and into the upper portions of device fins (FIG. 13).

At block 2220, (FIG. 14) a metal liner layer, such as TiN, is disposed upon the surfaces of the etched cavities. Deposition methods such as ALD, CVD and PVD are used to deposit the metal liner layer.

At block 2230 (FIG. 14), after removal of any remaining masking material, such as the removal of remaining OPL by ashing, a sacrificial material such as a-Si is deposited into the cavities upon the TiN by CVD, PVD or other deposition methods. At block 2240 (FIG. 15), a masking material, such as OPL is applied in a pattern to protect the decoupling capacitor cavity while exposing the SDB cavity, enabling the etching away of the sacrificial material and metal liner layer disposed in the SDB cavity. At block 2250 (FIG. 16), deposition of a dielectric material, such as SiN, into the SDB cavity occurs.

At block 2260 (FIG. 17), the device dummy gate structures and the sacrificial material disposed in the decoupling capacitor cavity is etched away by RIE or similar means. At block 2270 (FIG. 18), a dielectric liner material, such as HfO₂ or similar, is disposed upon the surfaces of the device using ALD or similar methods. At block 2280, deposition of gate metal material, followed by one or more CMP to trim the gate metal material and remove the dielectric liner material to the upper surfaces of the gate sidewall spacers, SDB, and decoupling capacitor, completes the device structures and the decoupling capacitor. Each of the SDB and the decoupling capacitor have a T-shaped cross-section. At block 2290 (FIG. 20), a conductive contact between the decoupling capacitor metal liner and a source-drain region of the device is formed using a method such as trench silicide formation.

The flowchart and block diagrams in the figures illustrate the architecture, functionality, and operation of possible implementations of systems, methods, and device fabrication steps according to various embodiments of the present invention. In this regard, each block in the flowchart or block diagrams may represent a module, segment, or portion of instructions, which comprises one or more fabrication steps for manufacturing the specified device(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:
a decoupling capacitor disposed between adjacent device source-drain epitaxial regions, the decoupling capacitor comprising an outer metal liner disposed between and in direct contact with the adjacent device source-drain epitaxial regions, a dielectric disposed in direct contact with the outer metal liner, and an inner metal liner disposed in direct contact with the dielectric; and
a single diffusion break isolation region disposed between the adjacent device source-drain epitaxial regions.

2. The semiconductor device according to claim 1, wherein the single diffusion break isolation region comprises an airgap.

3. The semiconductor device according to claim 1, wherein the decoupling capacitor comprises an airgap.

4. The semiconductor device according to claim 1, wherein the decoupling capacitor comprises a T-shaped cross-section.

5. The semiconductor device according to claim 1, wherein the single diffusion break isolation region comprises a T-shaped cross-section.

6. The semiconductor device according to claim 1, further comprising a gate spacer disposed adjacent to the decoupling capacitor and at least one of the device source-drain epitaxial regions.

7. The semiconductor device according to claim 1, wherein the outer metal liner is disposed in electrical contact with adjacent device source-drain epitaxial regions.

8. The semiconductor device according to claim 1 wherein the outer metal liner comprises TiN.

9. The semiconductor device according to claim 1 wherein the dielectric comprises $HfO_2$.

* * * * *